(12) United States Patent
Jung et al.

(10) Patent No.: US 7,652,362 B2
(45) Date of Patent: Jan. 26, 2010

(54) SEMICONDUCTOR PACKAGE STACK WITH THROUGH-VIA CONNECTION

(75) Inventors: Young Hy Jung, Kyoungki-do (KR); Chan Sun Lee, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 218 days.

(21) Appl. No.: 11/485,119

(22) Filed: Jul. 12, 2006

(65) Prior Publication Data

US 2007/0228544 A1  Oct. 4, 2007

(30) Foreign Application Priority Data

Mar. 29, 2006  (KR) .................. 10-2006-0028527

(51) Int. Cl.
*H01L 23/02* (2006.01)
(52) U.S. Cl. ...................... 257/686; 257/777
(58) Field of Classification Search .............. 257/686, 257/777, 776, E23.01, E23.079, E23.141, 257/E23.179; 438/109
See application file for complete search history.

(56) References Cited

U.S. PATENT DOCUMENTS 5,857,858 A * 1/1999 Gorowitz et al. .............. 439/86
6,734,541 B2 * 5/2004 Shimoe et al. .............. 257/686

FOREIGN PATENT DOCUMENTS

| JP | 10-135267 A | 5/1998 |
| KR | 1020020028038 | 4/2002 |
| TW | 472330 | 1/2002 |

* cited by examiner

*Primary Examiner*—Theresa T Doan
(74) *Attorney, Agent, or Firm*—Ladas & Parry LLP

(57) ABSTRACT

A package stack includes at least two packages stacked on each other. Each package has a substrate, a circuit pattern positioned on the substrate, a semiconductor chip attached to the substrate, and a number of through-vias formed on a lateral surface. A number of electrical connection members are attached to the through-vias so as to electrically connect the packages to each other. The through-vias are vertically positioned on the lateral or side surface of the packages. And a solder ball is attached to the lower surface of the substrate of the lowest package.

8 Claims, 2 Drawing Sheets

SEMICONDUCTOR PACKAGE STACK WITH THROUGH-VIA CONNECTION

BACKGROUND OF THE INVENTION

1. Field of the Invention

The present invention relates generally to a semiconductor package, and more particularly to a semiconductor package stack using through-via connection.

2. Description of the Prior Art

The technology for packaging semiconductor integrated circuits has continuously advanced in pursuit of more compact design while providing better mounting reliability such that, for example, the size of certain type of semiconductor packages is reduced to the size comparable to that of a typical semiconductor chip. Increasing the efficiency of the required processes for mounting the semiconductor packages and ensuring the continued mechanical/electrical reliability after the mounting are also important.

The term "stacking" generally refers to vertically piling up at least two semiconductor chips or packages one over the other. For example, two 256 M DRAMs can be stacked to form a single 512 M DRAM. Stacked packages provide high mounting density in the form of increased overall memory capacity per unit of mounting area.

FIG. 1 is a cross-sectional view of stacked conventional FBGA (fine pitch ball grid array) type packages. In FIG. 1, two FBGA-type packages 10, 20 are stacked utilizing two printed circuit boards (PCBs) 22, 24. The two packages 10, 20 are electrically connected to each other by a connection wall 26 interposed between the PCBs 22, 24 at the periphery of the lower package 10.

Each package 10 (or 20, hereinafter shown in parenthesis respectively) includes a substrate 2 (or 12); a semiconductor chip 1 (or 11) attached to the substrate 2 (or 12); a set of electrode terminals 3 (or 13) positioned on the respective substrate 2 (or 12) electrically connected to a set of bonding pads 1a (or 11a) of the respective semiconductor chip 1 (or 11) by, for example, a set of bonding wires 4 (or 14); a sealant 5 (or 15) for sealing the upper surface of the substrate 2 (or 12) over the semiconductor chips 1 (or 11) including the bonding wires 4 (or 14); and a set of solder balls 6 (or 16) attached to the lower surface of the respective substrate 2 (or 12).

The packages 10, 20 are mechanically attached respectively to the corresponding PCBs 20, 22 by the solder balls 6, 16 respectively while being electrically connected to respective circuit patterns 23, 25 of the PCBs 20, 22.

The lower PCB 22 has additional solder balls 28 attached to its lower surface, so that the lower PCB 22 can be mounted on an external circuit, particularly on a motherboard.

However, in this conventional arrangement, at least two PCBs 22, 24 and a connection wall 26 are necessary for electrical connection between stacked packages such that the manufacturing cost and the defective ratio are increased.

In addition, the basic structure of the conventional package stack, i.e. stacking two packages on each other, limits its compactness.

Furthermore, the connection wall such as 26 for connecting the PCBs 22, 24 requires space and makes it difficult to reduce the overall size and, as a result, the mounting area.

SUMMARY OF THE INVENTION

Accordingly, the present invention has been made to solve the above-mentioned and other problems occurring in the prior art, and an object of the present invention is to provide a package stack adapted to reduce the manufacturing cost and the defective ratio.

Another object of the present invention is to provide a package stack adapted for compactness.

Still another object of the present invention is to provide a package stack having no unnecessary space so that the overall size and the mounting area are reduced.

In order to accomplish these objects, there is provided a package stack including at least two packages stacked on each other, each package having a substrate, a circuit pattern positioned on the substrate, a semiconductor chip attached to the substrate, and a number of through-vias formed on a lateral surface; a number of electrical connection members attached to the through-vias so as to electrically connect the packages to each other, the through-vias being vertically positioned on the lateral surface of the packages; and a solder ball attached to a lower surface of the substrate of the lowest package.

Each package includes a substrate having a circuit pattern; a semiconductor chip attached to the substrate and electrically connected to the substrate; a sealant for sealing an upper surface of the substrate including the semiconductor chip; and a number of through-vias formed on a lateral surface of the sealant including the substrate.

The semiconductor chip is electrically connected to the substrate by a bonding wire or solder bump.

The through-vias have a plated surface, particularly a surface plated with copper.

The electrical connection members are conductive leads.

The electrical connection members are attached to the through-vias by solder.

The substrates are exposed by the through-vias so that the circuit patterns are electrically connected to conductive leads.

The package stack has 2-4 packages stacked on one another.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
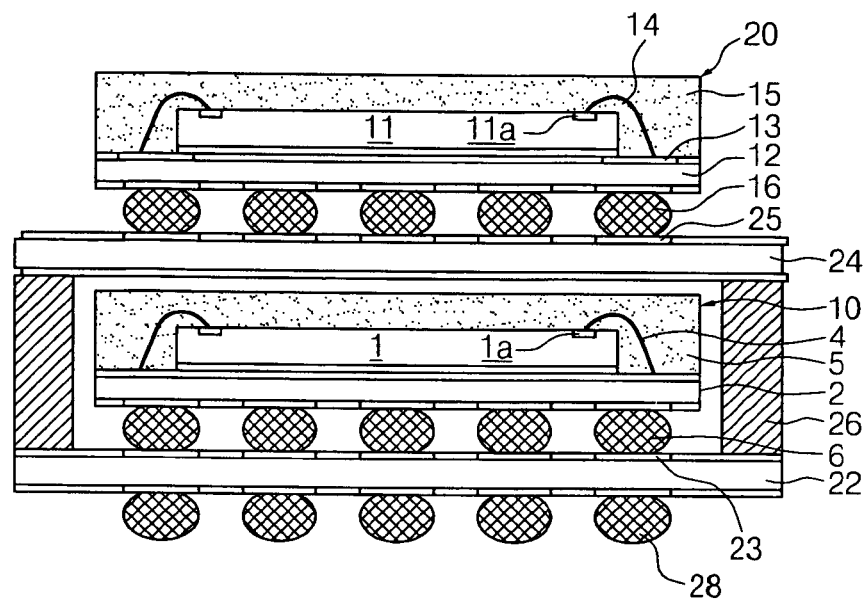
FIG. 1 is a cross-sectional view showing a conventional package stack.

Hereinafter, a preferred embodiment of the present invention will be described with reference to the accompanying drawings. In the following description and drawings, the same reference numerals may be used to designate the same or similar components, and so repetition of the description on the same or similar components will be omitted.

According to an embodiment of the present invention, when FBGA-type packages are stacked on another, plated-through-vias are formed on the lateral surface of each package, and conductive leads are positioned in the respective plated-through-vias for electrical connection between the stacked packages.

As such, the present invention does not require a separate space for stacking the packages. This reduces the overall size as well as the thickness of the stacked package providing compactness demanded by the current semiconductor technology. In addition, the present invention uses neither substrate nor connection wall when implementing a package stack, in contrast to the prior art. This reduces the manufacturing cost and the defective ratio.

A package stack according to an embodiment of the present invention will now be described in detail with reference to FIGS. 2-3, which are cross-sectional and perspective views, respectively, showing the same. In the drawings, the same reference numerals may be used to designate the same components as shown in FIG. 1.

Figure 2:
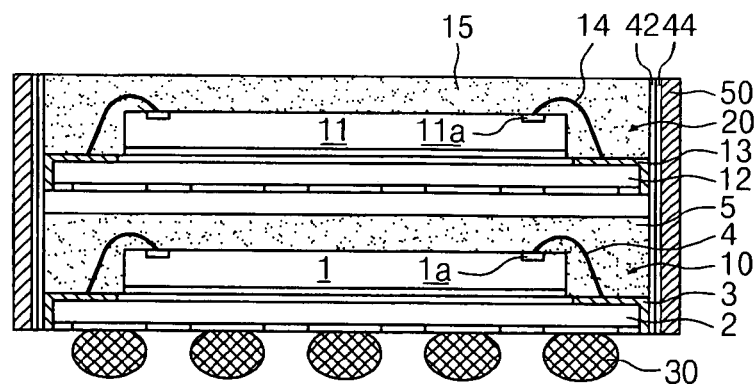
FIGS. 2 and 3 are a cross-sectional view and a perspective view, respectively, showing a package stack according to an embodiment of the present invention.
Figure 3:
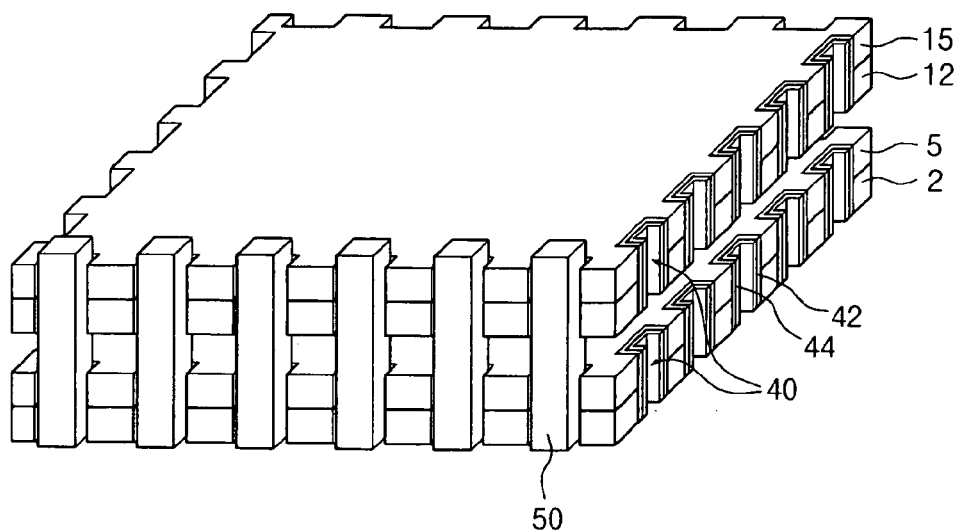

Referring to FIGS. 2-3, the package stack includes FBGA-type packages 10, 20 stacked one on top of the other and a number of electrical connection members, for example, conductive leads 50, for electrically connecting the stacked packages 10, 20.

Each FBGA-type package 10 (or 20 hereinafter shown in parenthesis respectively) includes, respectively, a substrate 2 (or 12) having a circuit pattern 3 (or 13); a semiconductor chips 1 (or 11) attached to the respective one of the substrates 2, 12 and electrically connected thereto; and a sealant 5 (or 15) for sealing the upper surface of the respective one of the substrates 2, 12, including the semiconductor chips 1 and 11. Particularly, a number of through-vias 40 (see FIG. 3) are formed on the lateral surface of the sealants 5 and 15, including the substrates 2 and 12.

The semiconductor chips 1 and 11 are electrically connected to the substrates 2 and 12, respectively, by bonding wires 4 and 14, for example, or by solder bumps when a flip chip bonding mode is applied.

The through-vias 40, which are formed by the lateral surface of the sealants 5 and 15 (see FIG. 2) including the substrates 2 and 12, are positioned so as to expose the circuit patterns 3 and 13 of the substrates 2 and 12. Therefore, the circuit patterns 3 and 13 of the substrates 2 and 12 are preferably positioned on the side surface of the substrates 2 and 12 so that they can be exposed by the through-vias 40 as this is shown in FIG. 2.

The through-vias 40 have a surface plated with a metal layer having excellent electrical conductivity, for example, a copper layer 42, and solder 44 is applied to the plate 42 for easy attachment of the conductive leads 50.

The lowest package 10 of the package stack according to an embodiment of the present invention has solder balls 30 attached to its lower surface, so that it can be mounted on an external circuit, particularly on a motherboard.

Processes for manufacturing the package stack according to an embodiment of the present invention will now be described.

Initially, a number of FBGA-type packages are fabricated at a wafer level. A number of through-vias are formed on the predetermined areas of the side surfaces of the packages fabricated at a wafer level near the scribe lines of the wafers by a conventional process.

After forming the through-vias, the resultant is successively subjected to a process for depositing a seed metal layer, a process for forming a photosensitive layer pattern, a plating process, and a process for removing the photosensitive layer pattern and the underlying seed metal layer, so that each through-via has a surface plated with a copper layer.

After each through-via has a surface plated with a copper layer, the packages fabricated at a wafer level are separated into discrete packages along the scribe lines. Then, the through-via, which has a plated surface, is exposed to the outside.

At least two packages, which have been obtained through the separation process, are stacked in such a manner that the through-vias, which are formed on their lateral surface, are arranged vertically.

Thereafter, solder is applied inside the through-vias of the packages, which have been arranged vertically. Conductive leads are attached inside the through-vias by using the solder, which is then subjected to wetting so that the copper layer on the surface of the through-vias is connected to the conductive leads for electrical connection between the stacked packages.

Solder balls are attached to the lower surface of the substrate of the lowest package, so that the package stack according to the present invention is completed.

As mentioned above, the package stack according to an embodiment of the present invention has stacked packages, which have plated through-vias on their lateral surface, and conductive leads positioned in the respective through-vias of the packages, which are positioned vertically, for electrical connection between the stacked packages. Therefore, no additional space is necessary for the electrical connection between the stacked packages. In addition, the through-vias and the conductive leads replace conventional PCBs and connection walls.

As a result, the package stack of the present invention has substantially reduced the overall size and the thickness when compared to the prior art, thereby realizing compactness. In addition, omission of expensive PCBs and connection walls decreases the manufacturing cost and the defective ratio.

Figure 4:
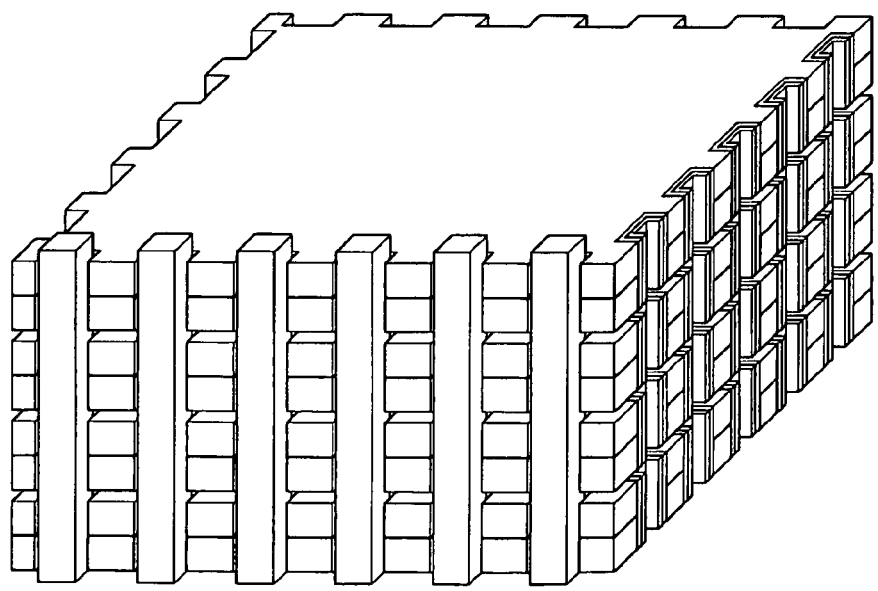
FIG. 4 is a perspective view showing a package stack according to another embodiment of the present invention.

Although the present embodiment has been described with reference to a package stack including two FBGA-type packages stacked on each other, more than two packages can be stacked on one another as desired. For example, four FBGA-type packages can be stacked on one another and constitute a package stack, as shown in FIG. 4.

As mentioned above, when the package stack according to an embodiment of the present invention is fabricated, the through-vias are formed on the lateral surface of packages, and the conductive leads are positioned in the through-vias of stacked packages for electrical connection among the stacked packages. Therefore, no separate space is necessary for electrical connection between the stacked packages, and expensive electrical connection parts can be omitted. This realizes compactness and reduces the manufacturing cost and the defective ratio.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A package stack comprising:
   at least two packages stacked one on top of the other, each package comprising:
   a substrate having a circuit pattern that extends a predetermined portion on a side surface of the substrate;
   a semiconductor chip attached and electrically connected to the substrate; and
   a number of through-vias formed in predetermined portions of the side surface of the package adjacent to the substrate and exposed to the outside, the lateral thickness of the respective through-vias extending from the side surface of the package to the substrate so as to expose the circuit pattern formed on the side surface of the substrate, wherein each through-via of one package is aligned with a corresponding through-via of the other stacked package to form a continues through-via on the side surfaces of the two stacked packages;

a number of electrical connection members, each of which is attached to each continous through-via on the side surface of the two stacked packages so as to electrically connect the two packages to each other, each continuous through-vias being vertically positioned on a predetermined portion of the side surface of the stacked packages, wherein the connection members are electrically connected to the circuit pattern exposed by the through-vias; and a solder ball attached to a lower surface of the substrate of the lowest package.

2. The package stack of claim 1, wherein each package further comprises:

a sealant sealing the upper surface of the substrate including the semiconductor chip, wherein the sealant is shaped on the side surfaces thereof to provide the through-vias exposed to the outside, such that each through-via is formed in the side surface of the sealant and extends from the side surface of the sealant to the substrate.

3. The package stack of claim 2, wherein the semiconductor chip is electrically connected to the substrate by a plurality of bonding wires or solder bumps, wherein the plurality of bonding wires or solder bumps are connected to the corresponding electrode terminals formed on the substrate, and wherein portions of electrode terminals are positioned on predetermined areas of the side surface of the substrate corresponding to the continuous through-vias.

4. The package stack of claim 3, wherein each continuous through-via has a plated surface contacting the electrode terminal.

5. The package stack of claim 4, wherein the through-vias have a surface plated with copper.

6. The package stack of claim 1, wherein the electrical connection members are conductive leads.

7. The package stack of claim 1, wherein the electrical connection members are attached to the through-vias by solder.

8. The package stack of claim 1, wherein 2-4 packages are stacked on one another.

* * * * *